(12) United States Patent
Liu

(10) Patent No.: US 12,406,117 B1
(45) Date of Patent: Sep. 2, 2025

(54) GENERATING AND UTILIZING MANUFACTURABLE NETLISTS OF THREE-DIMENSIONAL INTEGRATED CIRCUITS

(71) Applicant: Synopsys, Inc., Mountain View, CA (US)

(72) Inventor: Xun Liu, Cary, NC (US)

(73) Assignee: Synopsys, Inc., Mountain View, CA (US)

( * ) Notice: Subject to any disclaimer, the term of this patent is extended or adjusted under 35 U.S.C. 154(b) by 627 days.

(21) Appl. No.: 17/877,266

(22) Filed: Jul. 29, 2022

Related U.S. Application Data

(60) Provisional application No. 63/233,441, filed on Aug. 16, 2021.

(51) Int. Cl.
  *G06F 30/327* (2020.01)
  *G06F 30/3947* (2020.01)
  *G06F 30/3953* (2020.01)

(52) U.S. Cl.
  CPC ........ *G06F 30/327* (2020.01); *G06F 30/3947* (2020.01); *G06F 30/3953* (2020.01)

(58) Field of Classification Search
  CPC . G06F 30/3947; G06F 30/3953; G06F 30/327
  USPC ............................. 716/129, 130, 131; 703/14
  See application file for complete search history.

(56) References Cited

U.S. PATENT DOCUMENTS

| | | | | |
|---|---|---|---|---|
| 6,305,004 | B1 * | 10/2001 | Tellez | G06F 30/394 716/133 |
| 6,536,024 | B1 * | 3/2003 | Hathaway | G06F 1/10 327/295 |
| 7,171,644 | B1 * | 1/2007 | Laurence | G06F 30/30 716/121 |
| 7,237,214 | B1 * | 6/2007 | Pandey | G06F 30/327 716/131 |
| 9,123,721 | B2 * | 9/2015 | Samadi | G06F 30/392 |
| 11,625,522 | B2 * | 4/2023 | Sinha | G06F 30/34 716/108 |

(Continued)

OTHER PUBLICATIONS

Azarkhish, "Memory Hiearchy Design for Next Generation Scalable Many-core Platforms", University of Bologna, Italy, Feb. 23, 2016, 157 pages. (Year: 2016).*

(Continued)

*Primary Examiner* — Phallaka Kik
(74) *Attorney, Agent, or Firm* — Lowenstein Sandler LLP

(57) ABSTRACT

A processing device generates a routing graph in accordance with a three-dimensional integrated circuit (3DIC) configuration of a 3DIC device. The processing device performs net routing with respect to the routing graph. The processing device determines, based on a net routing result of the net routing, whether at least one valid modified routing graph exists in view of an initial netlist corresponding to the 3DIC device. In response to determining that at least one valid modified routing graph exists, the processing device selects a modified routing graph from the at least one valid modified routing graph. The processing device generates, based on the modified routing graph, an updated netlist that satisfies the 3DIC configuration and is logically equivalent to the initial netlist.

20 Claims, 11 Drawing Sheets

(56) References Cited

U.S. PATENT DOCUMENTS

| | | | |
|---|---|---|---|
| 2001/0009031 A1* | 7/2001 | Nitta | G06F 30/394 |
| | | | 716/129 |
| 2008/0222591 A1* | 9/2008 | Furukawa | G06F 30/323 |
| | | | 716/126 |
| 2015/0112646 A1* | 4/2015 | Kamal | G06F 30/39 |
| | | | 703/1 |
| 2020/0401179 A1* | 12/2020 | Subramaniam | G06F 30/396 |

OTHER PUBLICATIONS

Joseph, "Networks-on-Chip for Heterogeneous 3D Systems-on-Chip", Otto-vaon-Guericke Universitat Magdeburg, Feb. 2019, 263 pages. (Year: 2019).*

M'Zah, "ASIC Design Methodology for 3D NOC Based Heterogeneous Multi Processor on Chip", Micro and Nanotechnologies/Microelectronics, Ecole Polytechnique X, 2012, 196 pages. (Year: 2012).*

* cited by examiner

GENERATING AND UTILIZING MANUFACTURABLE NETLISTS OF THREE-DIMENSIONAL INTEGRATED CIRCUITS

RELATED APPLICATION

The present Application claims priority to U.S. Provisional Patent Application No. 63/233,441, filed Aug. 16, 2021, and entitled "GENERATING MANUFACTURABLE NETLISTS OF THREE-DIMENSIONAL INTEGRATED CIRCUITS," which is incorporated herein by reference in its entirety.

TECHNICAL FIELD

The present disclosure relates to the field of integrated circuit design, and in particular to generating and utilizing manufacturable netlists of a three-dimensional integrated circuit.

BACKGROUND

A netlist generally refers to a data structure that represents components of an integrated circuit (IC) and how the components are interconnected. A netlist is a starting point of an IC design process, and netlist generation is a preprocessing step of IC placement and routing. For example, a netlist can include a graph structure including nodes that represent the components of the IC and edges that represent how the components are interconnected.

SUMMARY

In one embodiment, a method is provided. The method includes generating, by a processing device, a routing graph in accordance with a three-dimensional integrated circuit (3DIC) configuration of a 3DIC device, performing, by the processing device, net routing with respect to the routing graph, determining, by the processing device and based on a net routing result of the net routing, whether at least one valid modified routing graph exists in view of an initial netlist corresponding to the 3DIC device, in response to determining that at least one valid modified routing graph exists, selecting, by the processing device, a modified routing graph from the at least one valid modified routing graph, and generating, by the processing device and based on the modified routing graph, an updated netlist that satisfies the 3DIC configuration and is logically equivalent to the initial netlist.

In another embodiment, a system is provided. The system includes a memory storing instructions, and a processing device operatively coupled to the memory. The instructions, when executed by the processing device, cause the processing device to perform operations including generating a routing graph in accordance with a three-dimensional integrated circuit (3DIC) configuration of a 3DIC device, performing net routing with respect to the routing graph, determining, based on a net routing result of the net routing, whether at least one valid modified routing graph exists in view of an initial netlist corresponding to the 3DIC device, in response to determining that at least one valid modified routing graph exists, selecting a modified routing graph from the at least one valid modified routing graph, and generating, based on the modified routing graph, an updated netlist that satisfies the 3DIC configuration and is logically equivalent to the initial netlist.

In one embodiment, a non-transitory computer-readable storage medium is provided. The non-transitory computer-readable storage medium has instructions stored thereon that, when executed by a processing device, cause the processing device to perform operations including generating a routing graph in accordance with a three-dimensional integrated circuit (3DIC) configuration of a 3DIC device, performing net routing with respect to the routing graph, determining, based on a net routing result of the net routing, whether at least one valid modified routing graph exists in view of an initial netlist corresponding to the 3DIC device, in response to determining that at least one valid modified routing graph exists, selecting a modified routing graph from the at least one valid modified routing graph, and generating, based on the modified routing graph, an updated netlist that satisfies the 3DIC configuration and is logically equivalent to the initial netlist.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
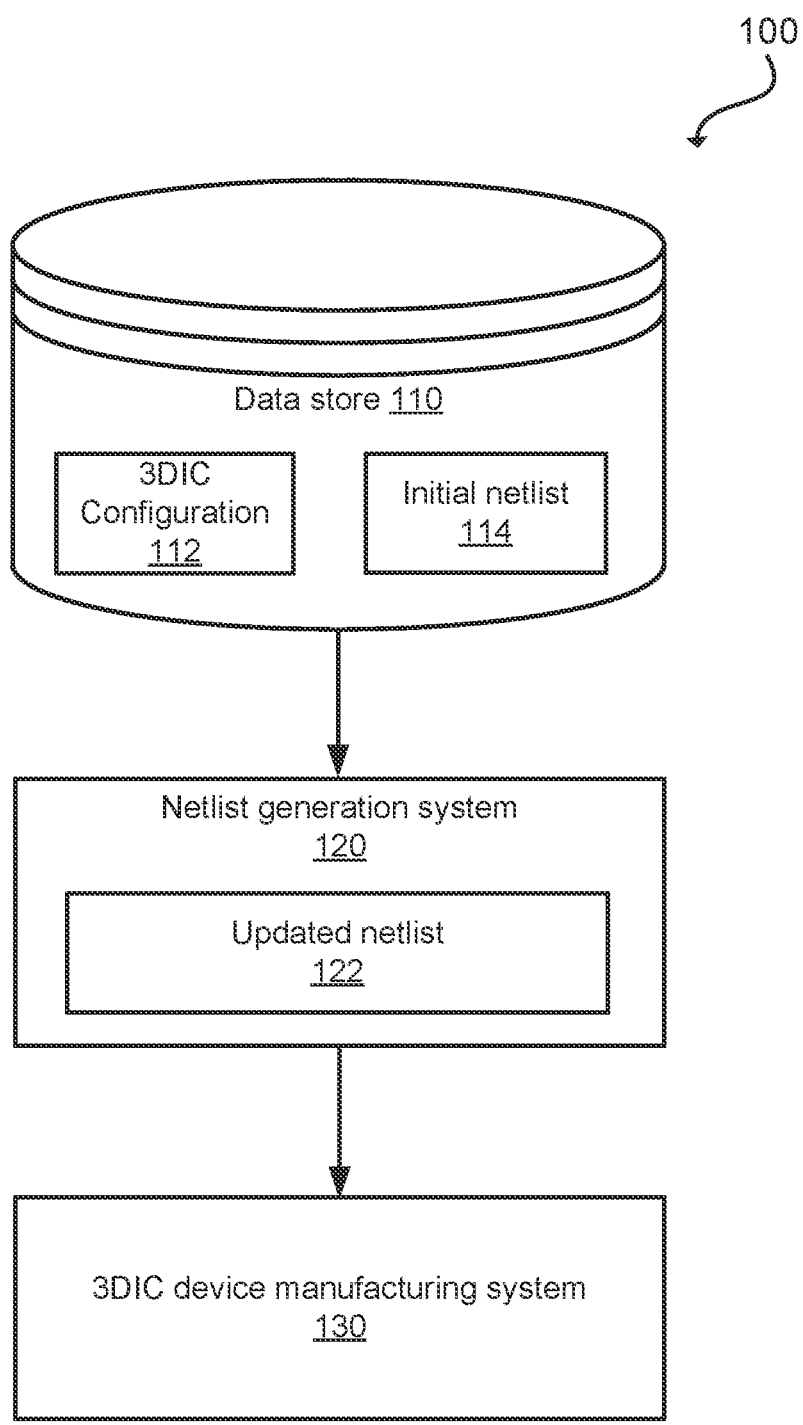
FIG. 1 is a block diagram of an example computing system for generating and utilizing netlists of a three-dimensional integrated circuit (3DIC) device, in accordance with some embodiments of the present disclosure.

Aspects of the present disclosure relate to generating and utilizing manufacturable netlists of three-dimensional integrated circuits (3DICs). It is becoming increasingly difficult to increase device density of traditional two-dimensional (2D) integrated circuits (ICs). Three-dimensional (3D) ICs (3DICs) have been proposed to continue increasing device density. A 3DIC device can be designed using a multi-die packaging technique that stacks multiple dice together to form a single system. A 3DIC device can be designed by forming connections, referred to as "touching surfaces," between an upper die and a lower die. For example, one stacking method includes using solder balls as touching surfaces. Direct inter-die data transmission between the upper die and the lower die can be possible if the upper die and the lower die are connected by such touching surfaces. In addition, because each touching surface forms a point-to-point connection, it may not be possible to implement inter-die networks ("nets") of more than two terminals.

A netlist can list one or more nets that exist between multiple dice of a 3DIC device (e.g., a logic-level or register-transfer level (RTL) netlist). A 3DIC configuration can include physical 3DIC design information. For example, a 3DIC configuration can include a die stacking and placement configuration corresponding to a 3D placement of a given design. The die stacking and placement configuration can reflect physical 3DIC design information.

In some cases, a netlist can violate a 3DIC configuration. For example, the 3DIC configuration (e.g., die stacking and placement configuration) may not be available during the netlist synthesis stage in which the netlist was created. This can render the netlist and the resulting 3DIC device "unmanufacturable." Even if a netlist is a "manufacturable netlist" that can be used to manufacture a 3DIC device in accordance with a 3DIC configuration (e.g., the netlist does not conflict with an 3DIC configuration), the 3DIC configuration can change over time. For example, the 3DIC configuration can change during 3DIC design exploration. When the 3DIC configuration changes, the netlist that was initially created for the 3DIC configuration ("initial netlist") may need to be modified to account for the change(s) to the 3DIC configuration ("modified netlist"). As an illustrative example, an interconnect-only die, called an interposer, may be added for inter-die data transfer after the creation of a netlist. The addition of the interposer can change the 3DIC configuration and can render the previously created netlist unmanufacturable. The complexity of netlist creation (e.g., initial netlist or modified netlist) can grow as the number of dice included in the 3DIC configuration increases over time. For example, as the number of dice increases ten-fold, 100-fold, etc., it may be impractical or even impossible to create at least one netlist that can be used to manufacture a 3DIC device satisfying a 3DIC configuration using typical netlist creation techniques.

Aspects and implementations of the present disclosure address these and other shortcomings by generating and utilizing manufacturable netlists of three-dimensional integrated circuits (3DICs). Embodiments described herein can be used to determine whether a manufacturable netlist can be generated from a netlist (e.g., original netlist) and a 3DIC configuration, and in response to determining that the manufacturable netlist can be generated, generate the manufacturable netlist. More specifically, the manufacturable netlist may need to meet certain conditions or criteria to be considered valid. For example, the manufacturable netlist should be electrically and/or logically equivalent to the netlist. As another example, inter-die connections within the manufacturable netlist should match the 3DIC configuration. If it is determined that a manufacturable netlist cannot be generated from the netlist and the 3DIC configuration, embodiments described herein can issue a failure notification (e.g., failure message) indicating that there is no valid manufacturable netlist. Additionally or alternatively, embodiments described herein can adjust the input data (e.g., the 3DIC configuration) in an attempt to obtain a manufacturable netlist. Further details regarding generating manufacturable netlists will be described in further detail below with reference to FIGS. 1-9.

Embodiments described herein can automatically generate correct netlists in an efficient manner that eliminates errors and can handle dice with complex 3D shapes, as well as future packaging techniques. For example, a netlist generated in accordance with embodiments described herein can be used to detect routing congestion, multi-die design verification, etc. Additionally, the data structures (e.g., graphs and/or trees) generated in accordance with embodiments described herein can enable fast net routing, which can improve computational efficiency during manufacturable netlist generation.

FIG. 1 depicts a block diagram of an example system 100 for generating and utilizing netlists of a three-dimensional integrated circuit (3DIC) device, in accordance with some embodiments of the present disclosure. As shown in FIG. 1, the system 100 includes at least one data store 110 (e.g., a database). The at least one data store 110 can maintain a set of data including 3DIC configuration 112 and an initial netlist 114.

The 3DIC configuration 112 can include physical 3DIC design information corresponding to a desired physical arrangement of 3DIC components. For example, the 3DIC configuration 112 can include a die stacking and placement configuration corresponding to a 3D placement of a given design.

The initial netlist 114 can list one or more nets that exist between multiple dice of a 3DIC device. For example, the initial netlist 114 can be an initial netlist (e.g., original netlist). More specifically, the netlist can include one or more nets describing desired connections between dice (i.e., one or more inter-die nets). The initial netlist 114 can include pins corresponding to respective die interfaces. Each pin can be associated with pin data describing pin features. For example, the pin data can describe the pin as an input pin, an output pin, etc. In some embodiments, the initial netlist 114 is a logic-level RTL netlist.

The system 100 can further include a netlist generation (NG) system 120. The NG system 120 is configured to perform a netlist generation process. More specifically, the netlist generation process can be performed to determine whether an updated netlist can be generated from the 3DIC configuration 112 and the initial netlist 114. If an updated netlist can be generated from the 3DIC configuration 112 and the initial netlist 114, then the NG system 120 can generate an updated netlist 122 that satisfies the 3DIC configuration 112 and is logically equivalent to the initial netlist 114. After generating the updated netlist 122, the NG system 120 can then send the updated netlist 122 to a 3DIC device manufacturing system 130 to manufacture a 3DIC device. Thus, the updated netlist 122 can be a manufacturable netlist that can be used to manufacture the 3DIC device. Further details regarding generating and utilizing netlists of a 3DIC device will now be described below with reference to FIGS. 2-9.

Figure 2:
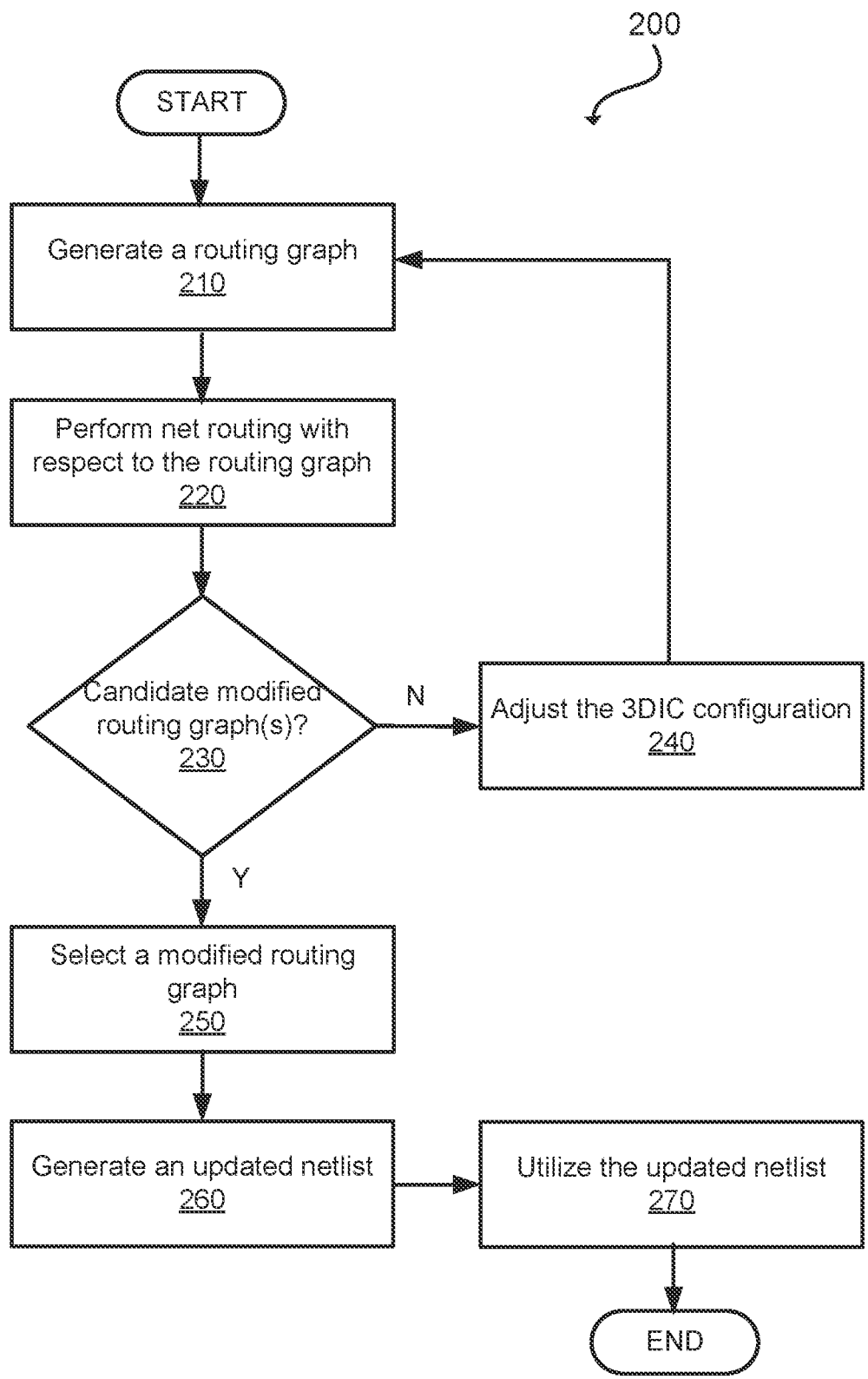
FIG. 2 is a flowchart of an example method for generating and utilizing netlists of a three-dimensional integrated circuit (3DIC) device, in accordance with some embodiments of the present disclosure.

FIG. 2 depicts a flowchart of an example method 200 for generating and utilizing netlists of a three-dimensional integrated circuit (3DIC) device, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the NG system 120 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, processing logic generates a routing graph. More specifically, processing logic can generate the routing graph for a net in accordance with a three-dimensional integrated circuit (3DIC) configuration of a 3DIC device. For example, the 3DIC configuration can be the 3DIC configuration 112 of FIG. 1.

In some embodiments, the routing graph is a weighted undirected graph. Generating the routing graph can include creating a set of vertices, with each vertex of the set of vertices representing a respective die surface area contacts. For example, each vertex can be created for each die surface region in which inter-die signal net might cross through and is connected to another die. If two surface areas are connected by physical connectors (e.g., solder balls), a simple edge can be added between the corresponding vertices. A hyper-edge, which is an edge that connects to multiple vertices, can be created for each die as a way to group the die. The package component can be handled in a similar manner, except that no hyper-edge is created. The package can be associated with an input port, an output port, or an in-out port.

At operation 220, processing logic performs net routing with respect to the routing graph. More specifically, the net routing can be performed in view of an initial netlist corresponding to the 3DIC device. For example, the initial netlist can be the netlist 114 of FIG. 1.

The net routing is performed to modify (e.g., simplify) the routing graph. Each net that connects to pins of more than one die can be routed one at a time, and performing net routing can further include updating edge attributes (e.g., routing capacity) for the net routing of a subsequent net. Any suitable method can be used to determine the order in which all nets are routed, in accordance with the embodiments described herein.

Performing net routing can include removing unnecessary vertices from the routing graph to obtain a modified set of vertices. Vertices to exclude from the routing graph and include in the modified set of vertices can be derived from pins of the initial netlist. More specifically, pins at the die boundaries ("boundary pins") can be considered during this process since the connectivity need not be changed between a pin within a die and a boundary pin. Thus, each boundary pin can be examined to derive a corresponding vertex. Further details regarding deriving vertices for boundary pins will now be described below with reference to FIG. 3.

Figure 3:
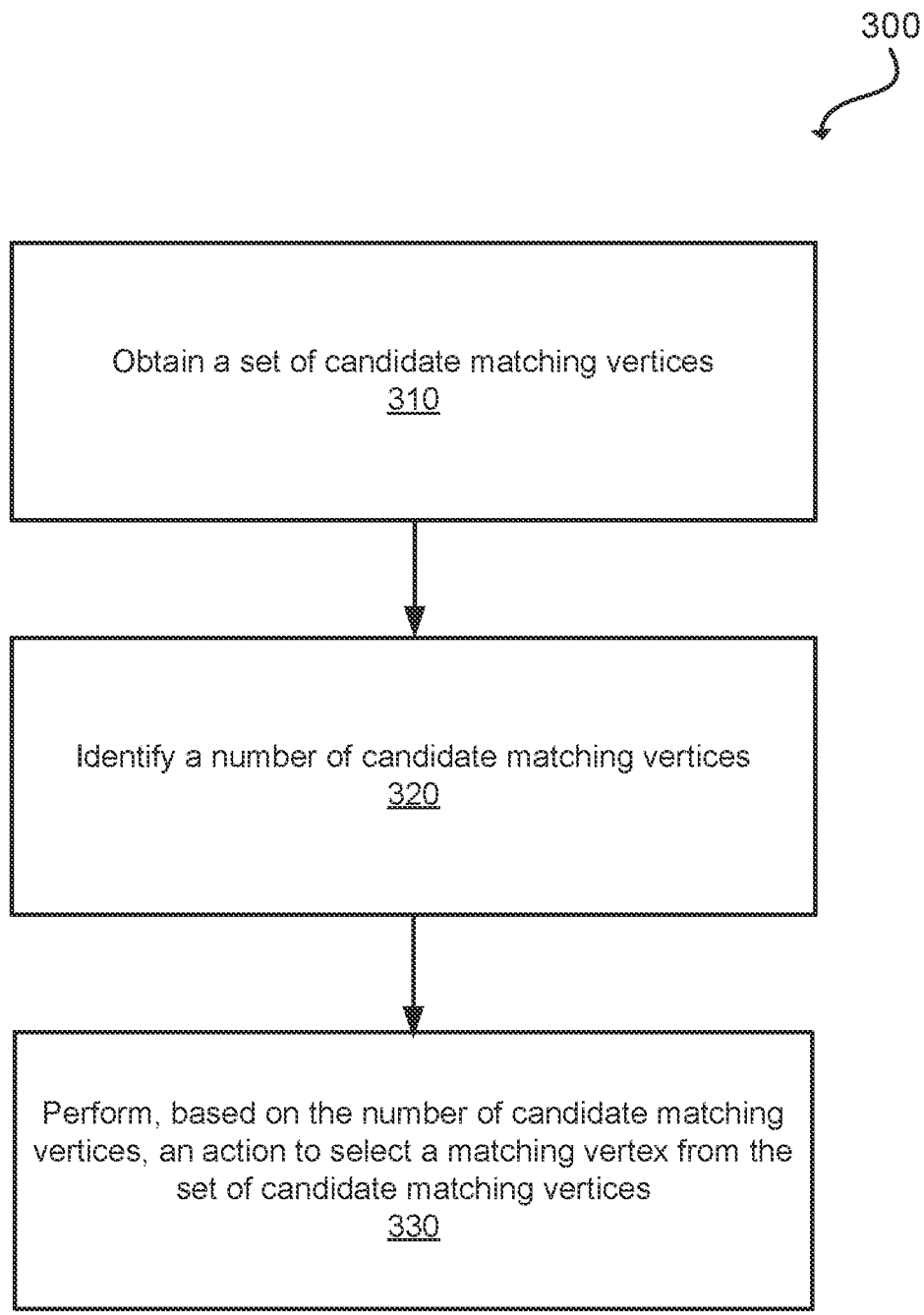
FIG. 3 is a flowchart of an example method for deriving vertices for boundary pins during net routing, in accordance with some embodiments of the present disclosure.

FIG. 3 depicts a flowchart of a method 300 for deriving vertices for boundary pins, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the NG system 120 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, processing logic obtains a set of candidate matching vertices. For example, obtaining the set of candidate matching vertices can include collecting any vertices determined match a pin of a net. The set of candidate matching vertices excludes wrong vertices, where each wrong vertex is a vertex that does not match the pin. For example, a pin may contain information indicating that the pin is on the front surface, such that any vertex on the back surface should be excluded.

At operation 320, processing logic identifies a number of candidate matching vertices of the set of candidate matching vertices. At operation 330, processing logic performs, based on the number of candidate matching vertices, an action to select a matching vertex from the set of candidate matching vertices.

For example, if the number of candidate matching vertices is zero (i.e., the set of candidate matching vertices is a null set), then processing logic cannot select a matching vertex from the set of candidate matching vertices. Thus, net routing has failed at operation 330, and the process ends. For example, the 3DIC configuration can be adjusted, and the process to obtain a modified routing graph can be repeated using the adjusted 3DIC configuration.

As another example, if the number of candidate matching vertices is one (i.e., the set of candidate matching vertices includes a single candidate matching vertex), then processing logic can select the single candidate matching vertex as the matching vertex at operation 330 since it is the only candidate matching vertex.

Note that a candidate matching vertex can be chosen for multiple pins. If the set of candidate matching vertices includes multiple candidate matching vertices (i.e., multiple vertices have been collected for the pin), then processing logic can select, based on logic connectivity, a best candidate matching vertex from the set of candidate matching vertices as the matching vertex at operation 330. For example, selecting the best candidate matching vertex can include finding, for each candidate matching vertex of the set of candidate matching vertices, another candidate matching vertex using its simple edge. Selecting the best candidate matching vertex can further include collecting the logical net connected to the pin on the top-level and other boundary pins on the net, and collecting matching vertex sets to select the best candidate matching vertex. If a candidate matching vertex of the set of candidate matching vertices cannot be any of the logical pins connected, then pruning is performed to remove the candidate matching vertex from the set of candidate matching vertices. Any suitable tiebreaking method can used to prune the set of candidate matching vertices.

After pruning, if there are still multiple candidate matching vertices remaining in the set of candidate matching vertices, then the candidate matching vertex that has not been assigned will be selected. For example, there can be multiple pins on a net, and each pin may be assigned to a matching vertex. A vertex can be assigned to multiple pins. During the assignment, if there are multiple candidate matching vertices for a pin, then the candidate matching vertex that has not been assigned to another pin is chosen. For example, assume that there are two pins P1 and P2 and two vertices V1 and V2. Assume that vertex V1 has been assigned to pin P1. If both vertices V1 and V2 can be assigned to pin P2, then vertex V2 is chosen since vertex V1 is already assigned to pin P1. Further details regarding matching vertex selection will be described in further detail below with reference to FIGS. 5-5B.

Referring back to FIG. 2, after excluding unnecessary vertices from the routing graph and obtaining the modified set of vertices, performing net routing at operation 220 can further include obtaining a net routing result from the modified set of vertices. For example, performing net routing can include using a graph traversal algorithm to generate the set of valid modified routing graphs. The graph traversal algorithm can include a shortest-path search algorithm. For example, the shortest-path search algorithm can be initiated by selecting an arbitrary vertex of the modified set of vertices as the starting point. For each vertex of the modified set of vertices, the shortest-path search algorithm can be performed to connect the vertex to another vertex of the modified routing graph, and thus route a pair of vertices of the modified routing graph. The result of the shortest-path search for each pair of vertices can be merged to the current result by adding only edges that did not previously exist. The shortest-path search algorithm should not yield a simple edge twice if the corresponding vertices are not matched to different pins. If there are total V vertices and E edges, the computational complexity to route each pair of vertices can be defined as $O(V^2+E)$, where O refers to Big O notation, and the computational complexity for the merge can be defined as $O(E)$. Therefore, the overall computational complexity can be defined as $O(EV+V^3)$. In a 3DIC graph, the number of vertex and edges are likely less than 1,000. Thus, the routing can be done very fast.

At operation 230, it is determined whether any valid modified routing graphs exist. More specifically, it is determined whether at least one valid modified routing graph exists based on the net routing result and in view of the initial netlist.

If at least one valid modified routing graph is not determined to exist at operation 230, this means that net routing has failed and the 3DIC configuration used to generate the routing graph is invalid in view of the initial netlist. More specifically, the 3DIC configuration has generated either zero candidate modified routing graphs, or at least one invalid modified routing graph that is in violation of the initial netlist.

Processing logic at operation 240 can then adjust the 3DIC configuration to obtain an adjusted 3DIC configuration (e.g., receive or generate the adjusted 3DIC configuration). For example, adjusting the 3DIC configuration can include adjusting the die stacking and placement configuration. The process can revert back to operation 210 to generate an adjusted routing graph in accordance with the adjusted 3DIC configuration.

If at least one valid modified routing graph is determined to exist at operation 230, this means that the 3DIC configuration used to generate the routing graph is valid in view of the initial netlist. At operation 250, processing logic can select a modified routing graph from the at least one valid modified routing graph. If the at least one valid modified routing graph a single valid modified routing graph, then the single valid modified routing graph can be selected as the modified routing graph.

In the event that the set of valid modified routing graphs includes multiple valid modified routing graphs (i.e., at least two valid modified routing graphs), a tiebreaking scheme can be used to select the modified routing graph from the set of valid modified routing graphs. Any suitable tiebreaking scheme can be used to select the modified routing graph from the multiple valid modified routing graphs. For example, a default tiebreaking scheme can include selecting the modified routing graph as a valid modified routing graph with the least total edge weight (i.e., the minimum total edge weight). If multiple valid modified routing graphs have the same total edge weight, then the default tiebreaking scheme can further include selecting modified routing graph as a valid modified routing graph with the least total edge weight and the fewest number of edges.

At operation 260, processing logic can generate an updated netlist based on the modified routing graph. More specifically, the updated netlist satisfies the 3DIC configuration and is logically equivalent to the initial netlist. For example, the updated netlist can be a manufacturable netlist that can be used to manufacture a 3DIC device in accordance with the 3DIC configuration.

In some embodiments, generating the updated netlist includes performing direction derivation for the vertices of the modified routing graph, and converting each vertex of the modified routing graph to pins and each edge of the modified routing graph to nets. During direction derivation, each vertex of the modified routing graph can be assigned a direction, unless the vertex has already been assigned to an existing pin, in which case the direction is the direction of the pin. The direction derivation can be performed by propagating the known directions in the routing path. For example, the data for each pin of the initial netlist can indicate whether the pin is an output pin, an input pin, or an in-out pin. If possible, pins and nets included in the initial netlist are to be used. Within each die, one net can be created for each input pin or in-out pin. Newly created output pins can be connected by a single net. An input pin, if it exists, can be connected to the net. Further details regarding direction derivation and generating the updated netlist will be described in further detail below with reference to FIGS. 7-8.

At operation 270, processing logic can utilize the updated netlist. More specifically the updated netlist can be used with respect to 3DIC device manufacture. For example, utilizing the updated netlist can include performing physical design and verification of the 3DIC device for manufacture. Physical design and verification can include placing-and-routing of the 3DIC device in view of the updated netlist. Additionally or alternatively, utilizing the updated netlist can include sending the updated netlist to a 3DIC manufacturing system (e.g., the 3DIC manufacturing system 130 of FIG. 1). The 3DIC manufacturing system 130 can initiate manufacture of the 3DIC device using the updated netlist.

Figure 4A:
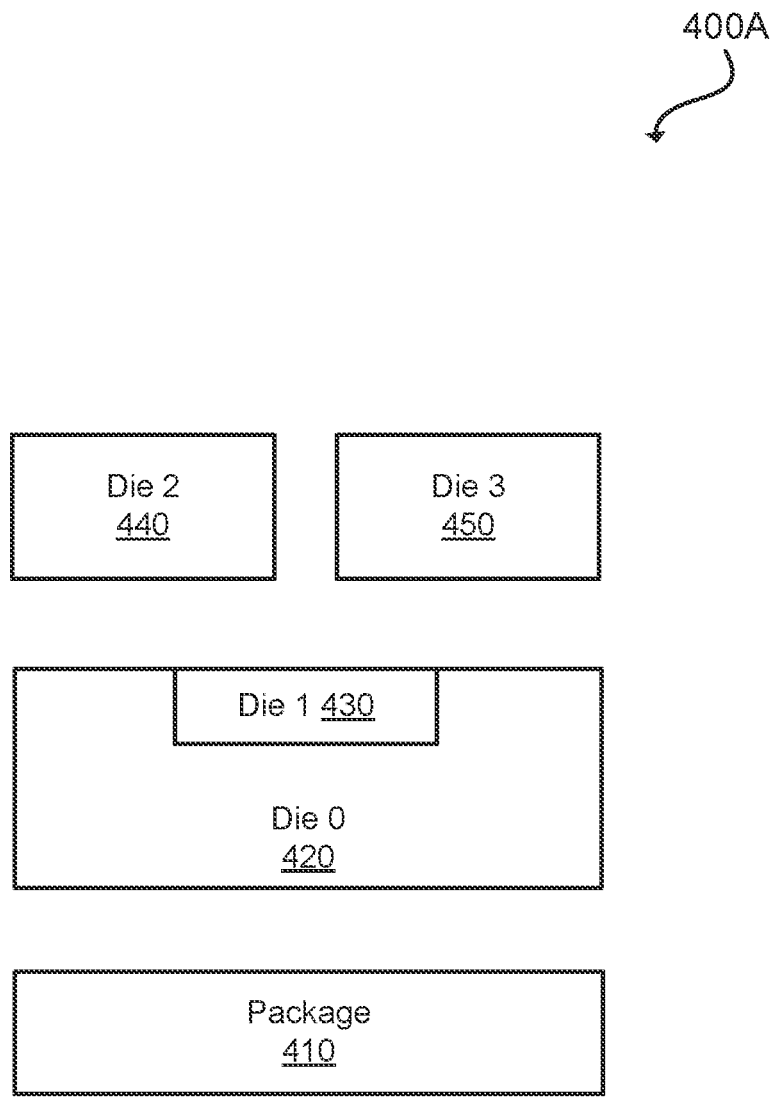
FIGS. 4A-4B are diagrams illustrating an example of routing graph generation, in accordance with some embodiments of the present disclosure.
Figure 4B:
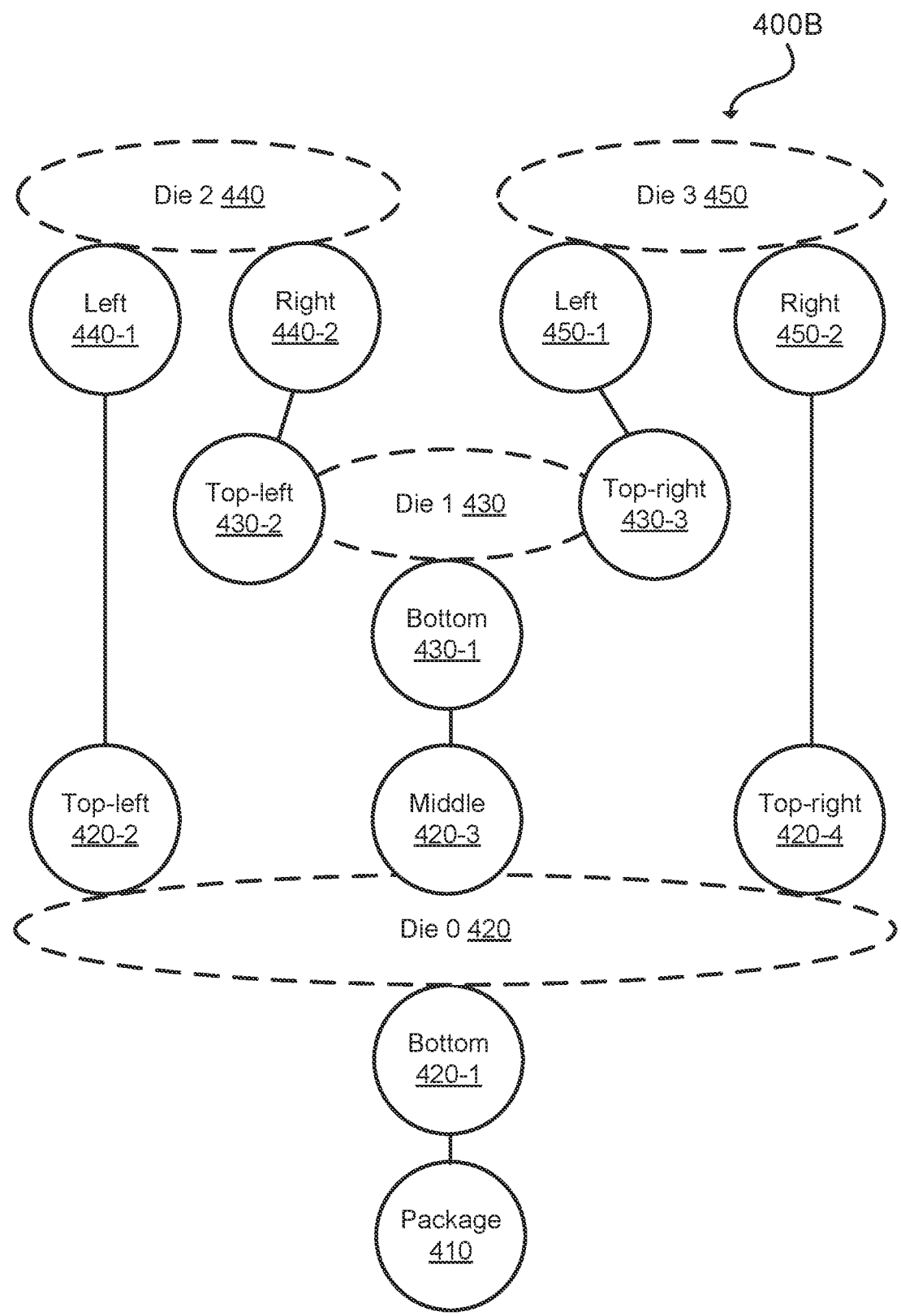

An illustrative example of generating and utilizing a netlist of a three-dimensional integrated circuit (3DIC) will now be described with reference to FIGS. 4A-8B. FIGS. 4A-4B are diagrams illustrating an example of routing graph generation, in accordance with some embodiments of the present disclosure. For example, FIGS. 4A-4B can illustrate operation 220 of FIG. 2 to generate a routing graph.

FIG. 4A illustrates a 3DIC configuration 400A including a die stacking and placement configuration of a package 410 and four dice, Die 0 420, Die 1 430, Die 2 440 and Die 3 450. FIG. 4B illustrates a routing graph 400B generated from the 3DIC configuration 400A. Each vertex represents an interface of a respective die and a respective contact point between the respective die and another die of the 3DIC configuration. The dotted oval shapes shown in the routing graph 400B correspond to hyper-edges. The straight-line edges shown in the routing graph 400B between respective pairs of vertices represent connections (e.g., inter-die signal transfer paths) between respective pairs of dies. Each of these edges can have weights representing the capacity of the corresponding interfaces. The weights can be determined, for example, based on area size and physical connector (e.g., solder ball) density. Moreover, a set of attributes can be assigned to the edges. For example, if a user prefers or disallows a certain net to cross at a certain edge, the weight specific to that net can be assigned to the corresponding edge.

In this illustrative example, Die 0 420 includes four vertices, including a bottom vertex 420-1, a top-left vertex 420-2, a middle vertex 420-3 and a top-right vertex 420-4. Die 1 430 includes three vertices, including a bottom vertex 430-1, a top-left vertex 430-2 and a top-right vertex 430-3. Die 2 440 includes two vertices, including a left vertex 440-1 and a right vertex 440-2. Die 3 450 similarly includes two vertices, including a left vertex 450-1 and a right vertex 450-2. Even though Die 2 440 only has a bottom surface connecting to other dice, it has two vertices 440-1 and 440-2 in the routing graph 400B because the surface of Die 2 440 has two areas, connected to Die 1 430 and Die 0 420, respectively. Similarly, Die 3 450 has two vertices. Die 1 430 has three vertices corresponding to its respective contacts with Die 0 420, Die 2 440 and Die 3 450, since no net crossing occurs along vertical die surfaces.

Figure 5:
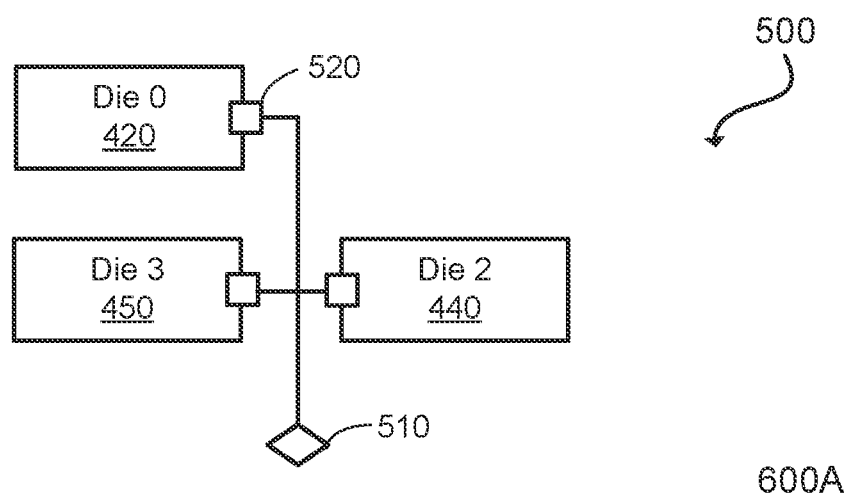
FIG. 5 is a diagram illustrating an example initial netlist, in accordance with some embodiments of the present disclosure.

FIG. 5 is a diagram illustrating an initial netlist 500, in accordance with some embodiments of the present disclosure. For example, the initial netlist 500 can be the initial netlist 114 of FIG. 1. The initial netlist 500 includes Die 0 420, Die 2 440 and Die 3 450, as described above with reference to FIGS. 4A-4B. The initial netlist 500 further includes a top-level port 510 corresponding to the package 410 described above with reference to FIGS. 4A-4B. The initial netlist 500 further includes a net connecting pins 520 on Die 0 420, Die 2 440 and Die 3 450 shown in FIG. 4A. In this example, the top-level port is an input port. However, the top-level port can alternatively be an output port, or an in-out port.

Figure 6A:
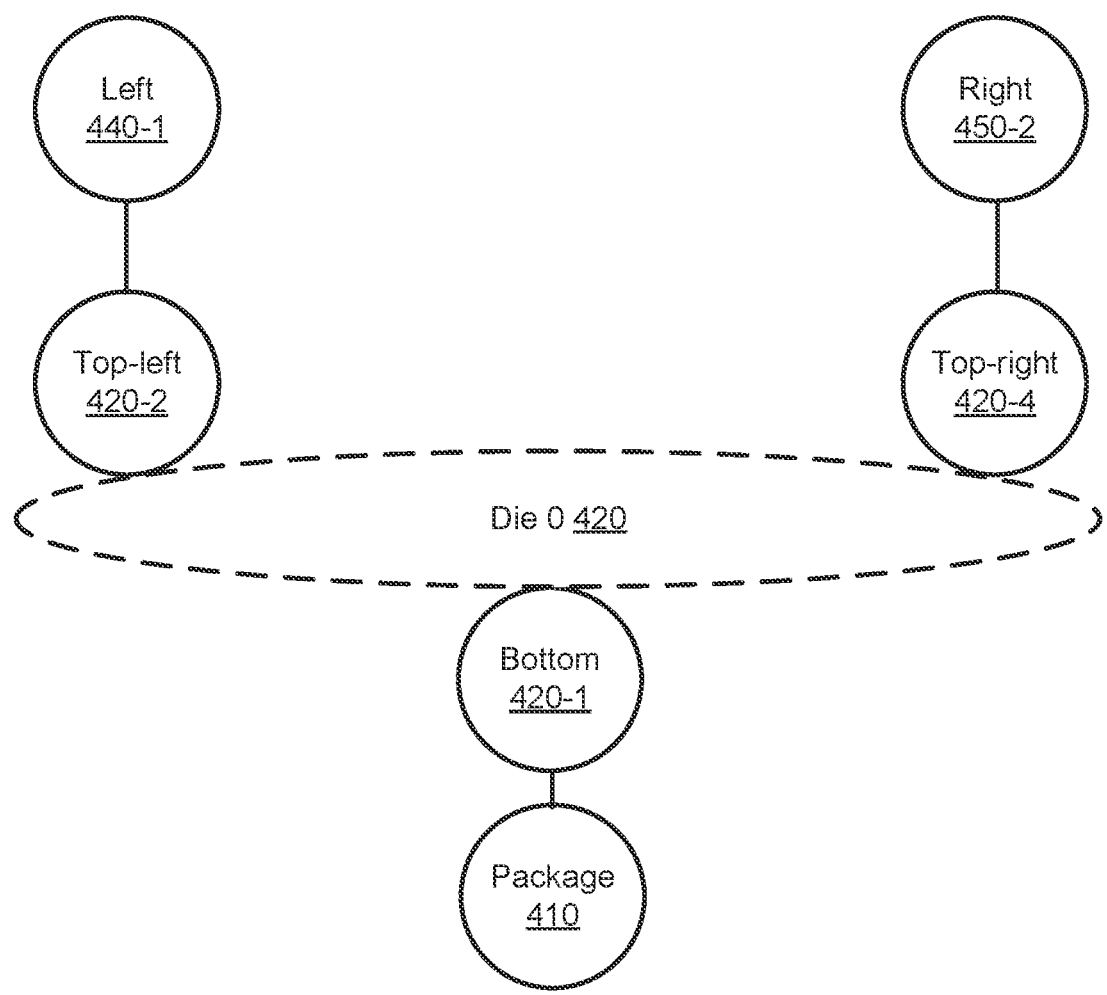
FIGS. 6A-6B are diagrams illustrating a comparison of example valid modified routing graphs, in accordance with some embodiments of the present disclosure.
Figure 6B:
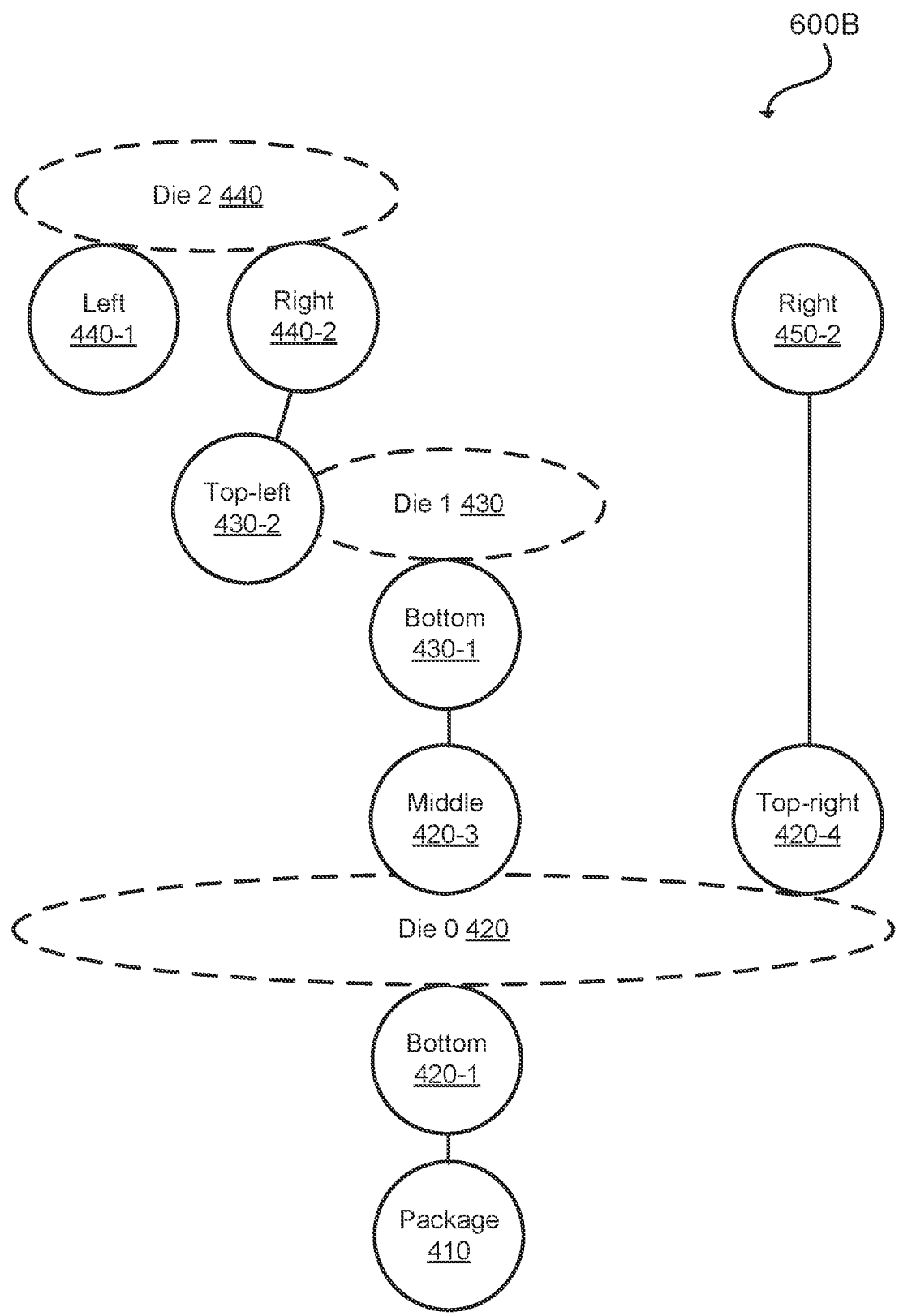

FIGS. 6A-6B depict a comparison of modified routing graphs obtained with respect to the routing graph 400B of FIG. 4B, in accordance with some embodiments of the present disclosure. More specifically, FIG. 6A is a diagram illustrating a modified routing graph 600A and FIG. 6B is a diagram illustrating a modified routing graph 600B. Both of the modified routing graphs 600A and 600B are valid in view of the initial netlist 500 of FIG. 5. Although only two valid modified routing graphs are shown, there can be more than two valid modified routing graphs for the initial netlist 500.

To obtain the modified routing graphs (including modified routing graphs 600A and 600B), it is noted that there are two vertices on Die 2 440 shown in routing graph 400B of FIG. 4B (i.e., the left vertex 440-1 connected to Die 0 420 the right vertex 4 connected to Die 1 430). For the pin 520 of Die 2 440 shown in diagram 500 of FIG. 5, only the left vertex 440-1 from the routing graph 400B is chosen for the modified routing graphs 600A and 600B, since the right vertex 440-2 (connected to Die 1 430 in FIG. 4B) is not shown as being connected to Die 1 430 in the initial netlist 500.

For the pin 520 of Die 3 450 shown in diagram 500 of FIG. 5, only the right vertex 450-2 of Die 3 is chosen for the modified routing graphs 600A and 600B, since the left vertex 450-1 (connected to Die 1 430 in FIG. 4B) is not shown as being connected to Die 1 430 in the initial netlist 500.

For pin 520 of Die 0 420 shown in the initial netlist 500, the bottom vertex 420-1, the top-left vertex 420-2 and the top-right vertex 420-4 are chosen for the modified routing graphs 600A and 600B, since the top-middle vertex 420-3 (connected to Die 1 430 in FIG. 4B) is not shown as being connected to Die 1 430 in the initial netlist 500. One of the three remaining vertices 420-1, 420-2 and 420-4 correspond to candidate vertices that can selected for the pin 520 on Die 0 420 (e.g., the bottom vertex 420-1).

Figure 7:
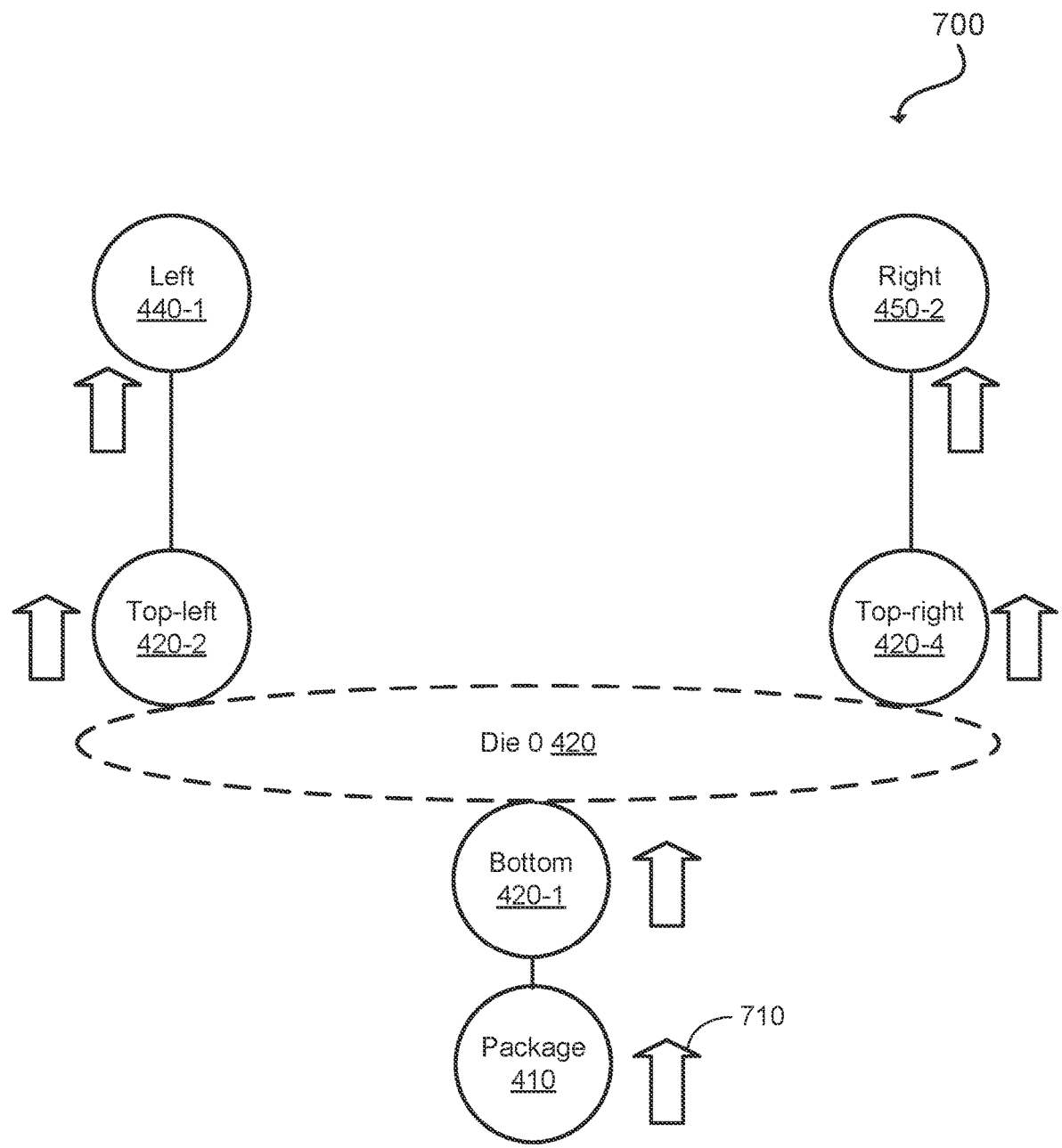
FIG. 7 is a diagram of an example direction derivation for generating an updated netlist, in accordance with some embodiments of the present disclosure.

FIG. 7 is a diagram 700 of an example of direction derivation for generating an updated netlist, in accordance with some embodiments of the present disclosure. It is assumed that the modified routing graph 600A was selected as the modified routing graph for generating an updated netlist because it has a minimum edge weight among the valid modified routing graphs (e.g., the total edge weight of the modified routing graph 600A is less than the total edge weight of the modified routing graph 600B) and/or because the modified routing graph 600A has the fewest number of edges among the valid modified routing graphs (e.g., the modified routing graph 600A has fewer edges than the modified routing graph 600B).

Diagram 700 shows the derivation of direction 710 of the vertices of the modified routing graph 600A of FIG. 6A. For example, each of the directions 710 can be indicated by pin data. The direction 710 of the package vertex 410 is the same as the direction of the top-level port 510 of the initial netlist 500 of FIG. 5. Die 2 440 has a single vertex 440-1 and Die 3 450 has a single vertex 450-2. Vertex 440-1 and vertex 450-2 are assigned to input pin 520 of Die 2 440 and the input pin 520 of Die 3 450, respectively. Therefore, the directions 710 of vertex 440-1 and the vertex 450-2 are input.

In contrast to Die 2 440 and Die 3 450, Die 0 has three vertices 420-1, 420-2 and 420-4. However, as shown in FIG. 5, Die 0 420 has a single pin 520 in the initial netlist 500. The direction 710 for the vertices of Die 0 420 can be derived based on the known directions and connectivity. For example, the direction 710 of vertex 420-1 of Die 0 420 can be an input direction since it is driven by the vertex 410, which is an input. The directions 710 of vertex 420-2 and vertex 420-4 are output since they are driven by vertex 420-1. After the direction derivation, vertex-to-pin mapping can be performed to generate an updated netlist, as will be described in further detail below with reference to FIGS. 8A-8B.

Figure 8A:
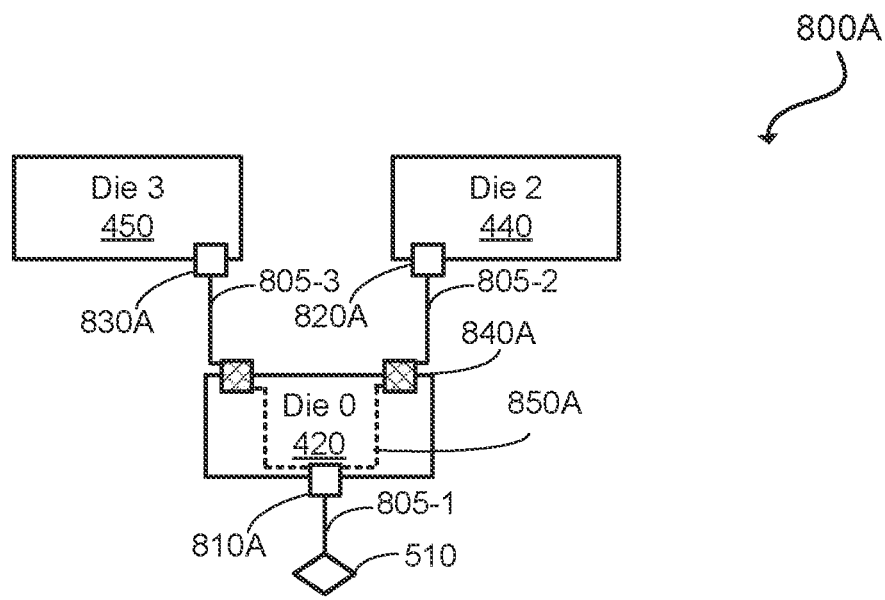
FIGS. 8A-8B are diagrams illustrating an example of netlist generation and utilization, in accordance with some embodiments of the present disclosure.
Figure 8B:
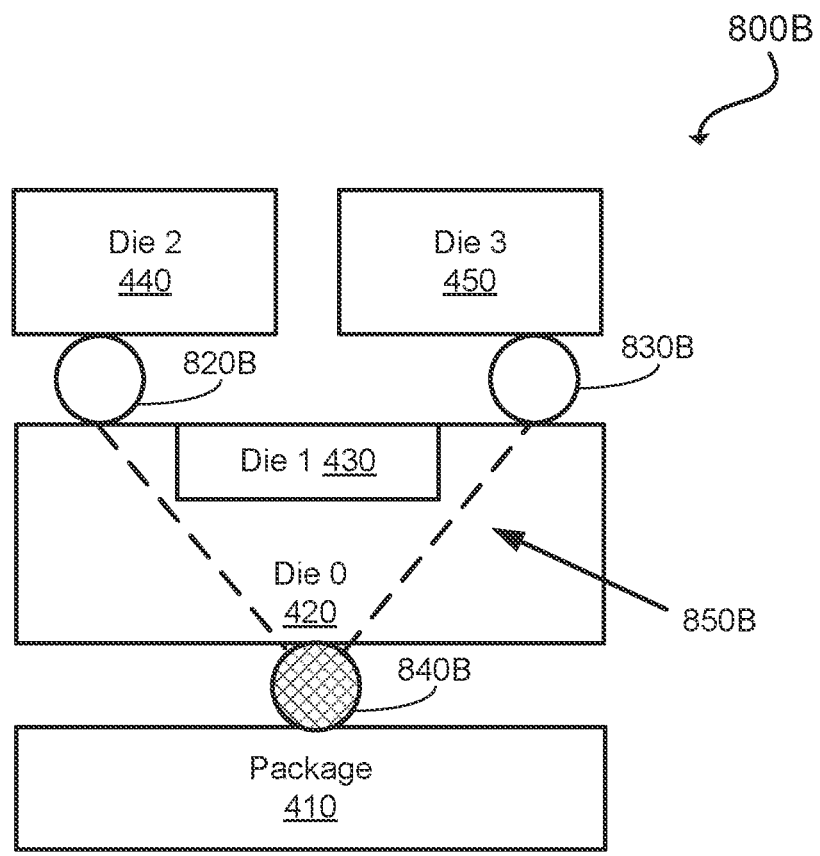

FIGS. 8A-8B are diagrams illustrating an example of netlist generation and utilization, in accordance with some embodiments of the present disclosure. For example, FIG. 8A depicts an updated netlist 800A that satisfies the 3DIC configuration 400A of FIG. 4 and is logically equivalent to the initial netlist 500 of FIG. 5. The updated netlist 800A includes the top-level port 510, Die 420, Die 2 440 and Die 3 450. The updated netlist 800A further includes input pins 810A through 830A corresponding to Die 0 440 through Die 3 450, respectively, and two output pins 840A corresponding to Die 0 440.

As compared to the initial netlist 500 of FIG. 5, two output pins 840A are added to Die 0 420, and a net 850A is added inside Die 0 420 to link each of the pins of Die 0 420. Moreover, a top-level net 805-1 now connects only top-level port 510 and the input pin 810A of Die 0 420, and two top-level nets 805-2 and 805-3 are added to connect the output pins 840A of Die 0 420 and input pins 520 of Die 2 and Die 3, respectively.

FIG. 8B depicts an example 3DIC device 800B that can be realized from the updated netlist 800A. The 3DIC device 800B illustrates the placement of physical connectors (e.g., solder balls) 820B through 840B corresponding to nets 805-1 through 805-3. For example, the physical connector 840B can represent the net 805-1. In addition, the routing from the physical connector 840B between the package 410 and Die 0 420 to the physical connectors between Die 0 420, Die 2 440 and Die 3 450, corresponding to internal interconnects 850B of Die 0 420, is shown. The particular routing shown can be based on, for example, the edge weights assigned to the edges of the corresponding graph.

Figure 9:
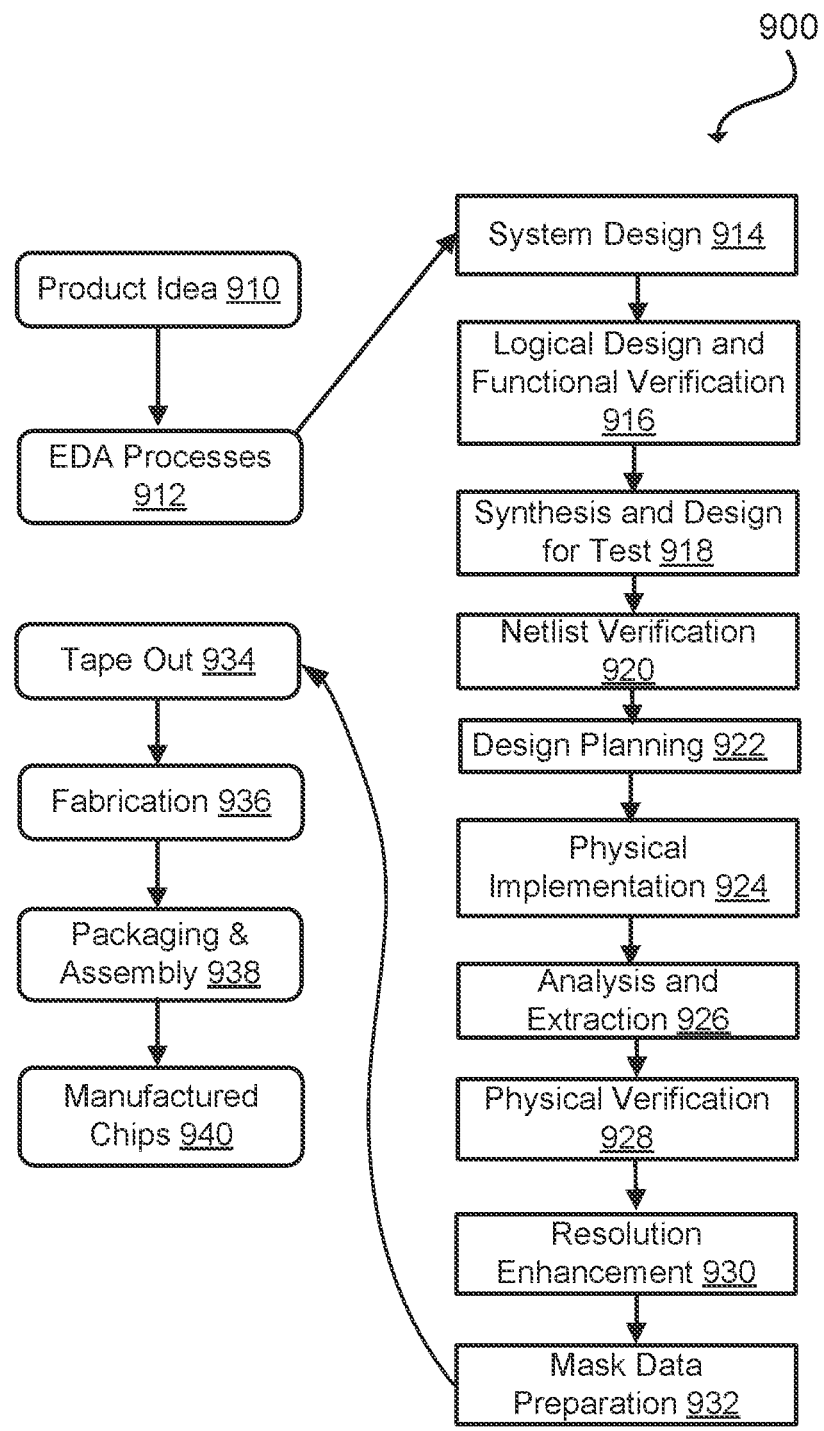
FIG. 9 is a flowchart of various processes used during the design and manufacture of an integrated circuit, in accordance with some embodiments of the present disclosure.

FIG. 9 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 938 are performed to produce the finished integrated circuit 940. Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 9. The processes described by be enabled by EDA products (or tools).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where nodes of the graph structure represent components of a circuit and where the edges of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1000 of FIG. 10) may be used to store the programs and data structures that are used by some or all of the EDA products described herein, and products used for development of cells for the library and for physical and logical design that use the library.

Figure 10:
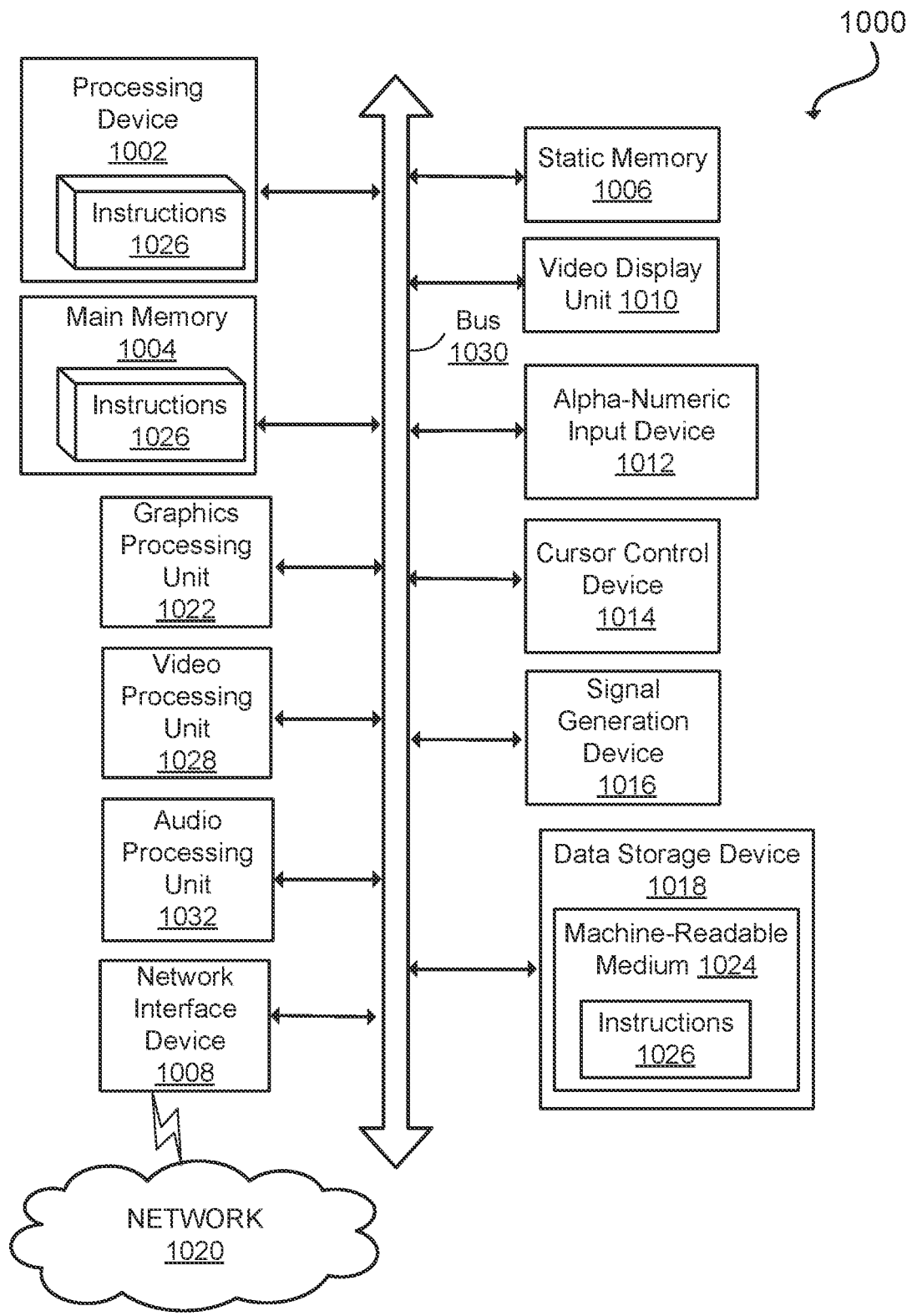
FIG. 10 is a diagram of an example computer system in which embodiments of the present disclosure may operate.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
generating, by a processing device, a routing graph in accordance with a three-dimensional integrated circuit (3DIC) configuration of a 3DIC device;
performing, by the processing device, net routing with respect to the routing graph;
determining, by the processing device and based on a net routing result of the net routing, whether at least one valid modified routing graph exists in view of an initial netlist corresponding to the 3DIC device;
in response to determining that at least one valid modified routing graph exists, selecting, by the processing device, a modified routing graph from the at least one valid modified routing graph; and
generating, by the processing device and based on the modified routing graph, an updated netlist that satisfies the 3DIC configuration and is logically equivalent to the initial netlist.

2. The method of claim 1, wherein performing net routing comprises:
obtaining a set of candidate matching vertices, wherein each candidate matching vertex of the set of candidate vertices matches a pin of a net;
identifying a number of candidate matching vertices of the set of candidate matching vertices; and
performing, based on the number of candidate vertices, an action to select a matching vertex from the set of candidate matching vertices.

3. The method of claim 2, wherein the set of candidate vertices comprises a plurality of candidate vertices, and wherein performing the action comprises selecting, based on logic connectivity, a best candidate matching vertex from the set of candidate matching vertices.

4. The method of claim 1, wherein the at least one valid modified routing graph comprises a plurality of valid modified routing graphs, and wherein selecting the modified routing graph comprises selecting a valid modified routing graph with a minimum edge weight.

5. The method of claim 1, further comprising:
in response to determining that at least one valid modified routing graph does not exist, adjusting, by the processing device, the 3DIC configuration to obtain an adjusted 3DIC configuration; and
generating, by the processing device, an adjusted routing graph based on the adjusted 3DIC configuration.

6. The method of claim 1, wherein generating the updated netlist comprises:
performing direction derivation for each vertex of the modified routing graph; and
after performing the direction derivation, converting each vertex of the modified routing graph to pins and each edge of the modified routing graph to nets.

7. The method of claim 1, further comprising utilizing the updated netlist with respect to 3DIC device manufacture.

8. A system comprising:
a memory storing instructions; and
a processing device operatively coupled to the memory, wherein the instructions, when executed by the processing device, cause the processing device to perform operations comprising:
generating a routing graph in accordance with a three-dimensional integrated circuit (3DIC) configuration of a 3DIC device;
performing net routing with respect to the routing graph;
determining, based on a net routing result of the net routing, whether at least one valid modified routing graph exists in view of an initial netlist corresponding to the 3DIC device;
in response to determining that at least one valid modified routing graph exists, selecting a modified routing graph from the at least one valid modified routing graph; and
generating, based on the modified routing graph, an updated netlist that satisfies the 3DIC configuration and is logically equivalent to the initial netlist.

9. The system of claim 8, wherein performing net routing comprises:
obtaining a set of candidate matching vertices, wherein each candidate matching vertex of the set of candidate vertices matches a pin of a net;
identifying a number of candidate matching vertices of the set of candidate matching vertices; and
performing, based on the number of candidate vertices, an action to select a matching vertex from the set of candidate matching vertices.

10. The system of claim 9, wherein the set of candidate vertices comprises a plurality of candidate vertices, and wherein performing the action comprises selecting, based on logic connectivity, a best candidate matching vertex from the set of candidate matching vertices.

11. The system of claim 8, wherein the at least one valid modified routing graph comprises a plurality of valid modified routing graphs, and wherein selecting the modified routing graph comprises selecting a valid modified routing graph with a minimum edge weight.

12. The system of claim 8, wherein the operations further comprise:
in response to determining that at least one valid modified routing graph does not exist, adjusting, by the processing device, the 3DIC configuration to obtain an adjusted 3DIC configuration; and
generating an adjusted routing graph based on the adjusted 3DIC configuration.

13. The system of claim 8, wherein generating the updated netlist comprises:
performing direction derivation for each vertex of the modified routing graph; and
after performing the direction derivation, converting each vertex of the modified routing graph to pins and each edge of the modified routing graph to nets.

14. The system of claim 8, wherein the operations further comprise utilizing the updated netlist with respect to 3DIC device manufacture.

15. A non-transitory computer-readable storage medium having instructions stored thereon that, when executed by a processing device, cause the processing device to perform operations comprising:
generating a routing graph in accordance with a three-dimensional integrated circuit (3DIC) configuration of a 3DIC device;
performing net routing with respect to the routing graph;

determining, based on a net routing result of the net routing, whether at least one valid modified routing graph exists in view of an initial netlist corresponding to the 3DIC device;

in response to determining that at least one valid modified routing graph exists, selecting a modified routing graph from the at least one valid modified routing graph; and generating, based on the modified routing graph, an updated netlist that satisfies the 3DIC configuration and is logically equivalent to the initial netlist.

16. The non-transitory computer-readable storage medium of claim 15, wherein performing net routing comprises:

obtaining a set of candidate matching vertices, wherein each candidate matching vertex of the set of candidate vertices matches a pin of a net;

identifying a number of candidate matching vertices of the set of candidate matching vertices; and performing, based on the number of candidate vertices, an action to select a matching vertex from the set of candidate matching vertices.

17. The non-transitory computer-readable storage medium of claim 16, wherein:

the set of candidate vertices comprises a plurality of candidate vertices;

performing the action comprises selecting, based on logic connectivity, a best candidate matching vertex from the set of candidate matching vertices;

the at least one valid modified routing graph comprises a plurality of valid modified routing graphs; and selecting the modified routing graph comprises selecting a valid modified routing graph with a minimum edge weight.

18. The non-transitory computer-readable storage medium of claim 15, wherein the operations further comprise:

in response to determining that at least one valid modified routing graph does not exist, adjusting, by the processing device, the 3DIC configuration to obtain an adjusted 3DIC configuration; and generating an adjusted routing graph based on the adjusted 3DIC configuration.

19. The non-transitory computer-readable storage medium of claim 15, wherein generating the updated netlist comprises:

performing direction derivation for each vertex of the modified routing graph; and after performing the direction derivation, converting each vertex of the modified routing graph to pins and each edge of the modified routing graph to nets.

20. The non-transitory computer-readable storage medium of claim 15, wherein the operations further comprise utilizing the updated netlist with respect to 3DIC device manufacture.

\* \* \* \* \*